United States Patent [19]

Kawagai et al.

[11] 4,173,756
[45] Nov. 6, 1979

[54] ABNORMAL VOLTAGE DETECTION CIRCUIT

[75] Inventors: Kenji Kawagai; Shigeki Yoshida, both of Kawasaki; Hisaharu Ogawa, Yokohama; Toshiro Ohashi, Kawasaki, all of Japan

[73] Assignee: Tokyo Shibaura Electric Co., Ltd., Japan

[21] Appl. No.: 858,209

[22] Filed: Dec. 7, 1977

[30] Foreign Application Priority Data

Dec. 11, 1976 [JP] Japan .................................. 51-148309

[51] Int. Cl.² ............................................ G08B 21/00
[52] U.S. Cl. ................................ 340/636; 58/23 BA; 340/663
[58] Field of Search ..................... 340/249, 248 B, 172, 340/636, 663; 320/48; 58/23 BA, 152 H

[56] References Cited

U.S. PATENT DOCUMENTS 4,041,691  8/1977  Chihara et al. .................. 58/23 BA Primary Examiner—John W. Caldwell, Sr.
Assistant Examiner—Daniel Myer
Attorney, Agent, or Firm—Finnegan, Henderson, Farabow & Garrett

[57] ABSTRACT

An abnormal voltage detection circuit includes a series circuit of a resistor and a capacitor coupled across a power source by means of a switch, an inverter with the input terminal coupled to the junction of the resistor and capacitor, and an R-S flip-flop circuit with the set and reset input terminals coupled to the output terminal of the inverter and a manual switch respectively. The R-S flip-flop circuit is set by a first threshold voltage lower than the threshold voltage of the inverter, and reset by a second threshold voltage higher than the threshold voltage of the inverter.

15 Claims, 6 Drawing Figures

PRIOR ART

ABNORMAL VOLTAGE DETECTION CIRCUIT

BACKGROUND OF THE INVENTION

This invention relates to an abnormal voltage detection circuit which can be incorporated into a large scale integrated circuit (LSI) for an electronic clock, for example.

Recently, there have been developed a variety of electronic clocks with batteries and the like used as a driving source. If the supply voltage is extremely lowered by any shock or the like applied to these kinds of electronic clocks, for example, then the LSI for clock use will cease to operate properly, thereby providing an incorrect indication of time. Therefore, it is needed to incorporate into the clock LSI an abnormal voltage detection circuit for monitoring the supply voltage level.

FIG. 1 shows a conventional abnormal voltage detection circuit, and FIG. 2 is a waveform diagram of voltages at several circuit points of the abnormal voltage detection circuit of FIG. 1. The abnormal voltage detection circuit of FIG. 1 is driven by a negative power source $V_{DD}$ composed of an AC power source and a rectifier circuit. Across the negative power source $V_{DD}$ is coupled by means of a switch SW1 a series circuit of a depression-type (D-type) P-channel metal insulated semiconductor field effect transistor (MIS FET) Q1 and an enchancement-type (E-type) P-channel MIS FET Q2. The gate and source of the FET Q1 are coupled to each other, while the gate of the FET Q2 is coupled to the negative power source $V_{DD}$. Further, a series circuit of a D-type P-channel MIS FET Q3 and an E-type P-channel MIS FET Q4 is coupled across the negative power source $V_{DD}$. The gate and source of the FET Q3 are coupled to each other, while the gate of the FET Q4 is coupled to the junction of the FET's Q1 and Q2. A capacitor C1 is a stray capacitor formed between the gate and source of the FET Q4.

In the abnormal voltage detection circuit as shown in FIG. 1, the FET's Q1 and Q4 are so formed as to have a lower mutual conductance as compared with the FET's Q2 and Q3, the threshold voltage of the FET Q2 is set a little lower than $V_{DD}$, and the threshold voltage of the FET Q4 is set lower than that of the FET Q2.

In this abnormal voltage detection circuit, when the switch SW1 is closed, that is, when the power supply, having been once cut off due to power failure or the like, is resumed, the voltage applied to the gate of the FET Q2 substantially rectilinearly rises up to the supply voltage $V_{DD}$, as indicated by curve $V_{G2}$ of FIG. 2. Also, the gate voltage of the FET Q4 rectilinearly rises accompanying curve $V_{G2}$, as indicated by curve $V_{G4}$. Before the gate voltage $V_{G4}$ of the FET Q4 reaaches the threshold voltage $V_{TH4}$ thereof, the FET Q4 is nonconducting, and the output voltage $V_{OUT}$ of the abnormal voltage detection circuit rises along curve $V_{G2}$. When the gate voltage $V_{G4}$ of the FET Q4 is made equal to the threshold voltage $V_{TH4}$, the FET Q4 conducts, and the output voltage $V_{OUT}$ of the circuit drops to the earth potential. Thereafter, when the gate voltage $V_{G2}$ of the FET Q2 reaches the threshold voltage $V_{TH2}$ thereof, the FET Q2 is caused to conduct, lowering the gate voltage $V_{G4}$ of the FET Q4 down to the earth potential. Consequently, the FET Q4 is rendered nonconducting, and the circuit output voltage $V_{OUT}$ rises up to the level of the supply voltage. If the output voltage of the negative power source $V_{DD}$ is not high enough to allow the gate voltage $V_{G2}$ of the FET Q2 to reach the threshold voltage $V_{TH2}$, then the FET Q2 is prohibited from conducting, so that the FET Q4 is kept conductive and the output voltage $V_{OUT}$ is kept at a low level to energize the display unit 1, and thus an abnormal voltage is detected.

Thus, the abnormal voltage detection circuit as shown in FIG. 1 may satisfactorily operate with the power source $V_{DD}$ to produce DC voltages by rectifying AC. However, with a DC power source such as batteries, it may not properly operate for the following reason. That is, when the switch SW1 is closed, the gate voltage $V_{GD2}$ of the FET Q2 rapidly rises in such a manner as indicated by a broken line in FIG. 2. In this case the gate voltage of the FET Q4 rises slowly, because it is obtained as the output voltage of an integration circuit formed of the FET Q1 and the stray capacitor C1. Accordingly, the FET Q2 is caused to conduct before the FET Q4 is allowed to conduct, thus permanently prohibiting the FET Q4 from conducting. As a result, the abnormal voltage detection circuit produces the voltage $V_{DD}$, which prevents detection of abnormal voltages.

SUMMARY OF THE INVENTION

An object of this invention is to provide an abnormal voltage detection circuit capable of being stably driven by either of a DC power source, such as batteries, and a power source to produce a DC voltage by rectifying an AC securely to detect the supply voltage dropping below a prescribed level.

According to an embodiment of the invention, there is provided an abnormal voltage detection circuit comprising first and second power source terminals, an integration circuit coupled between the first and second power source terminals, an inversion circuit with the input terminal coupled to the output terminal of the integration circuit, and a flip-flop circuit connected to receive at a first input terminal thereof output signals from the inversion circuit and set at a first position upon receipt of an output voltage higher than the threshold voltage of the inversion circuit.

DETAILED DESCRIPTION OF THE PREFERRED EMBODIMENT

Figure 2:
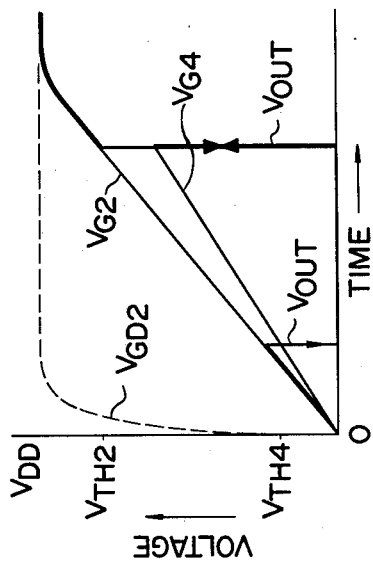
FIG. 2 is a waveform diagram of signals at several circuit points of the abnormal voltage detection circuit shown in FIG. 1.
Figure 1:
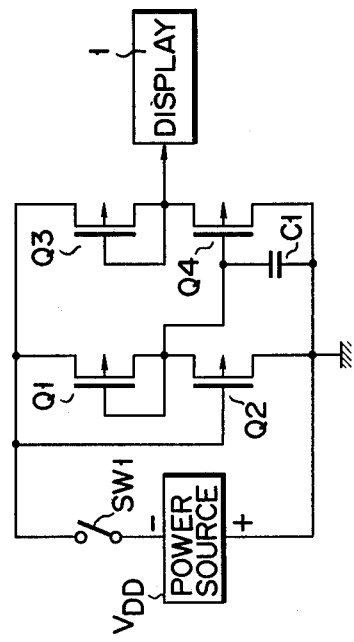
FIG. 1 is a circuit diagram of a conventional abnormal voltage detection circuit.
Figure 3:
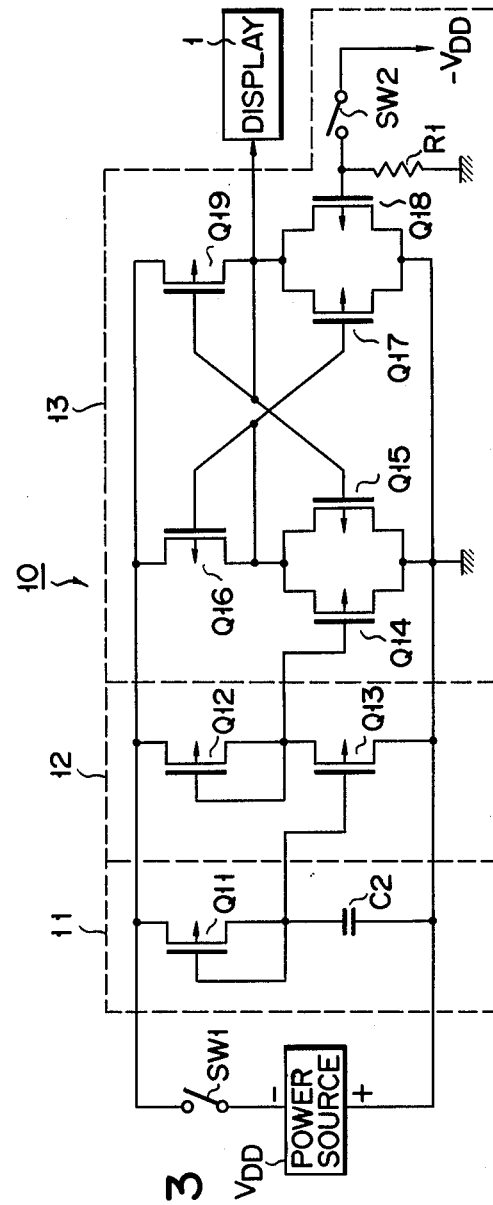
FIG. 3 is a circuit diagram of the abnormal voltage detection circuit according to an embodiment of this invention.

FIG. 3 shows an abnormal voltage detection circuit 10 according to an embodiment of the invention. The abnormal voltage detection circuit 10 shown in FIG. 3 is provided with an integration circuit 11 coupled across a negative power source $V_{DD}$ by means of a switch SW1, an inversion circuit 12 coupled to the integration circuit 11, and a flip-flop circuit 13 whose output state is changed in response to the output signal of the inversion circuit 12.

The integration circuit 11 is composed of a P-channel IG FET Q11, with the drain coupled to the negative power source $V_{DD}$ by means of the switch SW1 and the source and gate coupled to each other, and a capacitor C2 coupled between the source of the IG FET Q11 and the earth point. The inversion circuit 12 is composed of a P-channel IG FET Q12 with the drain coupled to the negative power source $V_{DD}$ and the source and gate coupled to each other, and a P-channel IG FET Q13 with the drain coupled to the source of the IG FET Q12, the gate coupled to the source of the IG FET Q11, and the source grounded. Meanwhile, the flip-flop circuit 13 is formed of a P-channel IG FET Q14 with the gate coupled to the drain of the IG FET Q13 and the source grounded, a P-channel IG FET Q15 with the source and drain coupled to the source and drain of the IG FET Q14 respectively, a P-channel IG FET Q16 with the drain coupled to the negative power source $V_{DD}$ and the source coupled to the drains of the IG FET's Q14 and Q15, a P-channel IG FET Q17 with the gate coupled in common to the gate and source of the IG FET Q16 and the source grounded, a P-channel IG FET Q18 with the source and drain coupled to the source and drain of the IG FET Q17 respectively and the gate grounded by means of a resistor R1 and coupled to the negative power source $V_{DD}$ by means of a switch SW2, and a P-channel IG FET Q19 with the gate and source coupled in common to the gate of the IG FET Q15 as well as to the drains of the IG FET's Q17 and Q18. The drains of the IG FET's Q17 and Q18 are coupled to a display unit 1.

In the abnormal voltage detection circuit 10 shown in FIG. 3, the threshold voltage of the IG FET Q14 is set lower than that of the IG FET Q13, while the threshold voltage of the IG FET Q17 is set higher than that of the IG FET Q13. Further, the IG FET Q13 is so formed as to have mutual conductance lower than that of the IG FET Q12, while the IG FET's Q16, Q17 and Q18 are so formed as to have a lower mutual conductance as compared with the IG FET's Q14, Q15 and Q19.

Suppose now that, in this abnormal voltage detection circuit 10, a DC power source, such as mercury batteries, is used for the negative power source $V_{DD}$.

Figure 4:
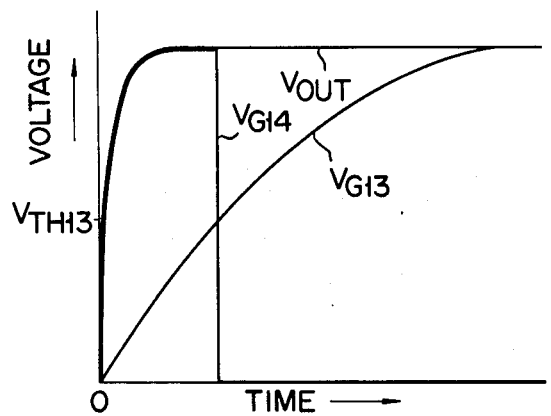
FIGS. 4 and 5 are waveform diagrams of voltage signals at several circuit points of the abnormal voltage detection circuit of FIG. 3.

When the switch SW1 is closed, that is, when the power source $V_{DD}$, once disconnected by external shock or the like, is normally coupled again, the integration output signal of the integration circuit 11, i.e., the gate voltage of the FET Q13 gently rises up to the supply voltage $V_{DD}$, as indicated by curve $V_{G13}$ of FIG. 4. Since at the earlier stage the FET Q13 is in the nonconducting state, the output signal of the inversion circuit 12, i.e., the gate voltage of the FET Q14 sharply rises up to the supply voltage $V_{DD}$ and is then kept at the same voltage level $V_{DD}$, as indicated by curve $V_{G14}$. Accordingly, the FET Q14 of the flip-flop circuit 13 is allowed to conduct, while the FET's Q16 and Q17 are rendered nonconducting. The FET Q17 now in nonconductive state causes the FET's Q15 and Q19 to conduct, and an output voltage $V_{OUT}$ produced from the flip-flop circuit 13 will vary along the curve $V_{G14}$.

Thereafter, when the output voltage of the integration circuit 11 reaches the threshold voltage $V_{TH13}$ of the FET Q13, the FET Q13 is allowed to conduct. Consequently, the output voltage of the inversion circuit 12 drops substantially to the 0V level, thereby rendering the FET Q14 nonconducting. In this case, the FET Q15 is kept conductive even when the FET Q14 is brought into the nonconducting state, so that the output level of the flip-flop circuit 13 will not be changed, and kept at the level of the supply voltage $V_{DD}$. The display unit 1 is energized by the output voltage at a low level, that is, $V_{DD}$ level from the flip-flop circuit 13, and indicates that an abnormal voltage is caused. When in this state a reset signal is applied to the base of the FET Q18 by operating the switch SW2, thereby causing the FET Q18 to conduct, the FET's Q15 and Q19 are rendered nonconducting and the FET's Q16 and Q17 are allowed to conduct. Accordingly, the flip-flop circuit 13 is reset to produce the output voltage at a high level, that is, 0V level, thereby de-energizing the display unit 1.

In this case, unless the output voltage of the power source $V_{DD}$ is high enough, the output voltage $V_{G13}$ of the integration circuit 11 will not reach the threshold voltage $V_{TH13}$ of the FET Q13, keeping the FET Q13 in the nonconducting state. Thus, the FET Q14 is kept conductive, the flip-flop circuit 13 is kept in the set state, and the output voltage at level $V_{DD}$ is produced from the flip-flop circuit 13, thereby energizing the display unit 1.

Figure 5:
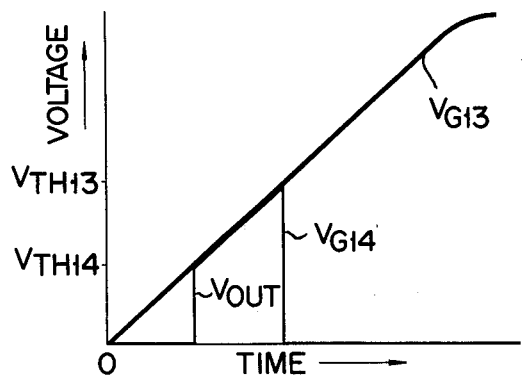

Referring now to FIG. 5, there will be assumed a case in which we use a power supply provided with an AC power source and a rectification circuit to rectify the output power from the AC power source.

When the switch SW1 is closed, that is, when the supply voltage, having been temporarily cut off due to power failure or the like, is resupplied, the integration output signal of the integration circuit 11, i.e., the gate voltage of the FET Q13 rectilinearly rises up to the supply voltage $V_{DD}$, as indicated by curve $V_{G13}$ of FIG. 5. Also, the output voltage of the inversion circuit 12, i.e., the gate voltage $V_{G14}$ of the FET Q14 rises along curve $V_{G13}$ at the initial stage. At such initial stage the flip-flop circuit 13 is reset, producing the output voltage at the 0V level. When the gate voltage $V_{G14}$ of the FET Q14 reaches the threshold voltage $V_{TH14}$ thereof, the FET Q14 is caused to conduct, thereby setting the flip-flop circuit 13. The flip-flop circuit 13 set produces the output voltage varying with the gate voltage $V_{G13}$. Thereafter, when the output voltage of the integration circuit 11 reaches the threshold voltage $V_{G13}$ of the FET Q13, the FET Q13 is caused to conduct, thereby lowering the gate voltage $V_{G14}$ of the FET Q14 down to the 0V level. Consequently, the FET Q14 is rendered nonconducting. In this case the FET Q15 is kept conductive, so that the flip-flop circuit 13 is kept in the set state. Accordingly, the flip-flop circuit 13 produces an output voltage varying with the gate voltage $V_{G13}$ up to the supply voltage $V_{DD}$, thereby energizing the display unit 1. When in this state a reset signal is applied to the base of the FET Q18 by operating the switch SW2, thereby causing the FET Q18 to conduct, the flip-flop circuit 13 is reset to produce the output voltage at the 0V level, thereby de-energizing the display unit 1.

Figure 6:
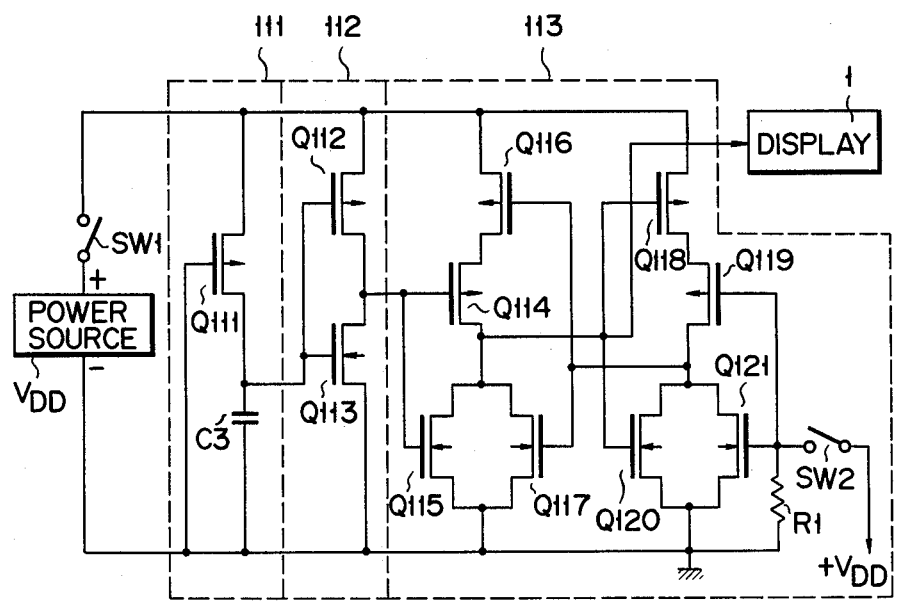
FIG. 6 is a circuit diagram of the abnormal voltage detection circuit according to an alternative embodiment of the invention.

FIG. 6 shows an abnormal voltage detection circuit 100 according to another embodiment of the invention.

The abnormal voltage detection circuit 100 is provided with an integration circuit 111 to integrate the output voltage of a positive power source $V_{DD}$, and inversion circuit 112 coupled to the integration circuit 111, and a flip-flop circuit 113 whose output state is switched in response to the output signal of the inversion circuit 112.

The integration circuit 111 is composed of a P-channel IG FET Q111 and a capacitor C3 and operates on the same principle as the integration circuit 11 as shown in FIG. 3. The inversion circuit 112 is composed of a CMOS transistor circuit having a P-channel IG FET Q112 and an N-channel IG FET Q113. The output terminal of the inversion circuit 112 is coupled to the gates of a P-channel IG FET Q114 and an N-channel IG FET Q115 in the flip-flop circuit 113. Between the drain of the FET Q114 and the power source $V_{DD}$ is coupled a P-channel IG FET Q116, while an N-channel IG FET Q117 is coupled between the source of the FET Q114 and the ground point. Further, the flip-flop circuit 113 is provided with a P-channel IG FET Q118 with the drain coupled to the positive power source $V_{DD}$, a P-channel IG FET Q119 with the drain coupled to the source of the FET Q118, and N-channel IG FET's Q120 and Q121 with their respective drains coupled to the source of the FET Q119 and the sources grounded. The gates of the FET's Q116 and Q117 are coupled in common to the source of the FET Q119, while the gates of the FET's Q118 and Q120 are coupled in common to the source of the FET Q114 as well as to the display unit 1. Meanwhile, the gates of the FET's Q119 and Q121 are grounded by means of a resistor R1 and coupled to the positive power source $V_{DD}$ by means of a switch SW2.

When the switch SW1 is closed, using a power source to rectify AC as the positive power source $V_{DD}$, the FET's Q112 and Q113 are at the initial stage rendered nonconducting, and the inversion circuit 112 produces an output voltage divided by these FET's Q112 and Q113. Consequently, the FET Q114 is brought into the nonconducting state, and the FET Q115 is allowed to conduct, thereby setting the flip-flop circuit 113, which supplies the display unit 1 with a low-level voltage. Thereafter, when the integration output voltage of the integration circuit 111 reaches a predetermined level, the FET Q113 is caused to conduct. Thus, the FET Q111 is allowed to conduct and the FET Q115 is rendered nonconducting, though the flip-flop circuit 113 is kept in the set state to go on energizing the display unit 1, because the FET Q117 is kept conductive.

Thereafter, when the FET's Q121 and Q119 are made conducting and nonconducting respectively by operating the switch SW2, the flip-flop circuit 113 is reset to supply the display unit 1 with a high-level or $V_{dd}$-level output signal, thereby de-energizing the display unit 1.

When the switch SW1 is closed, using a DC power source, such as mercury batteries, as the positive power source $V_{DD}$, the FET Q112 is caused to conduct, the FET Q113 is rendered nonconducting, and the flip-flop circuit 113 is set. Thereafter, when the output voltage of the integration circuit 111 reaches the predetermined level, the FET's Q112 and Q113 are made nonconducting and conducting respectively, while the FET Q115 is put into the nonconducting state. Since the FET Q117 is kept conductive, however, the flip-flop circuit 113 is kept in the set state, continuing to energize the display unit 1. The set state of the flip-flop circuit 113 may be released by operating the switch SW2 to render the FET Q119 nonconducting and allow the FET Q121 to conduct.

Although illustrative embodiments of this invention have been described in detail herein, it is to be understood that the invention is not limited to those precise embodiments.

For example, N-channel IG FET's may be used in place of the P-channel IG FET's used in the embodiment as shown in FIG. 3. Further, the switch SW2 may be so constructed as to be closed in response to the operation of a switch (not shown) which is operated for correction of time.

What we claim is:

1. An abnormal voltage detection circuit comprising first and second power source terminals; a integration circuit coupled between said first and second power source terminals; an inversion circuit having an input terminal connected to the output terminal of said integration circuit; and means for detecting a voltage interrupt at said source terminals comprising flip-flop means, connected to receive at a first input terminal thereof an output signal from said inversion circuit, for being set into a first condition indicating abnormal voltage upon resumption of interrupted voltage to said source terminals in response to a predetermined absolute voltage lower than the absolute threshold voltage of said inversion circuit and for remaining set even after said threshold voltage of said inversion circuit is surpassed.

2. An abnormal voltage detection circuit according to claim 1 wherein said flip-flop circuit is formed of an R-S flip-flop circuit having a set input terminal coupled to the output terminal of said inversion circuit and a reset input terminal coupled to a power source through a switch.

3. An abnormal voltage detection circuit according to claim 2, wherein said flip-flop circuit is composed of a plurality of IG FET's.

4. An abnormal voltage detection circuit according to claim 2, wherein said flip-flop circuit is composed of a plurality of CMOS FET's.

5. An abnormal voltage detection circuit according to claim 1, wherein said integration circuit is formed of a series circuit of a resistive means and a capacitor, and produces an output signal from the junction of said resistive means and capacitor.

6. An abnormal voltage detection circuit according to claim 5, wherein said resistive means is composed of a field effect transistor.

7. An abnormal voltage detection circuit according to claim 1, wherein said inversion circuit is formed of a series circuit of a resistive means and a field effect transistor coupled between said first and second power source terminals.

8. An abnormal voltage detection circuit according to claim 7, wherein said resistive means is composed of a field effect transistor.

9. The detector circuit of claim 1 further including resetting means for independently resetting said flip-flop means upon said resumption of interrupt voltage with said flip-flop remaining reset only upon said power source terminals surpassing said higher absolute threshold voltage of said inversion circuit.

10. An abnormal voltage detection circuit comprising first and second power source terminals; an integration circuit coupled between said first and second terminals; an inversion circuit having an input terminal connected to the output terminal of said integration circuit, said inversion circuit having a first threshold voltage; and a flip-flop circuit constituted by first and second field effect transistors whose current paths are connected in parallel to each other, the gate terminal of said first field effect transistor being connected to the output terminal of said inversion circuit, first resistive means connected in series with said first field effect transistor, third and fourth field effect transistors whose current paths are connected in parallel to each other, the gate terminal of said third field effect transistor being connected to the junction between said first resistive means and said first field effect transistor, second resistive means connected in series with said fourth field effect transistor, the junction between said second resistive means and fourth field effect transistor being connected to the gate terminal of said second field effect transistor; and switching means connected to the gate terminal of said fourth field effect transistor, said first and second field effect transistors being formed to have a threshold voltage lower than said first threshold voltage of said inversion circuit and said third and fourth field effect transistors being formed to have a threshold voltage higher than said first threshold voltage of said inversion circuit.

11. An abnormal voltage detection circuit according to claim 10, wherein said first resistive means is formed of a fifth field effect transistor whose gate terminal is connected to the junction between said first and fifth field effect transistors, and said second resistive means is formed of a sixth field effect transistor whose gate terminal is connected to the junction between said fourth and sixth field effect transistors.

12. An abnormal voltage detection circuit according to claim 10, wherein said inversion circuit is formed of a third resistive means and a field effect transistor whose gate terminal is connected to the output terminal of said integration circuit and whose current path is connected in series with said third resistive means.

13. An abnormal voltage detection circuit according to claim 11, wherein said inversion circuit is formed of a third resistive means and a field effect transistor whose gate terminal is connected to the output terminal of said integration circuit and whose current path is connected in series with said third resistive means.

14. An abnormal voltage detection circuit comprising an integration circuit; an inversion circuit having an input terminal connected to the output terminal of said integration circuit, said inversion circuit having a first threshold voltage; and a flip-flop circuit constituted by first and second field effect transistors of a first channel type whose current paths are connected in parallel to each other, third and fourth field effect transistors of a second channel type different from said first channel type, the current path of said fourth field effect transistor being connected in series with said first field effect transistor through said third field effect transistor and the gate terminals of said first and third field effect transistors being connected to the output terminal of said inversion circuit, fifth and sixth field effect transistors of the first channel type whose current paths are connected in parallel to each other, seventh and eighth field effect transistors of the second channel type, the current path of said eighth field effect transistor being connected in series with said sixth field effect transistor through said seventh field effect transistor, the gate terminals of said fifth and eighth field effect transistors being connected to the junction of said first and third field effect transistors, and the junction between said fifth and seventh field effect transistors being connected to the gate terminals of said second and fourth transistors; and switching means connected to the gate terminals of said sixth and seventh field effect transistors, a series circuit of said first, third and fourth field effect transistors and a series circuit of said second, third and fourth field effect transistors being formed to have a threshold voltage lower than the first threshold voltage of said inversion circuit and a series circuit of said fifth, seventh and eighth field effect transistors and a series circuit of said sixth, seventh and eighth field effect transistors being formed to have a threshold voltage higher than the first threshold voltage of said inversion circuit.

15. An abnormal voltage detection circuit according to claim 14, wherein said inversion circuit is formed of a ninth field effect transistor of the first channel type and a tenth field effect transistor of the second channel type whose current path is connected in series with said ninth field effect transistor and whose gate terminal is connected to the output terminal of said integration circuit together with the gate terminal of said ninth field effect transistor.

* * * * *